(12) United States Patent
Zhao et al.

(10) Patent No.: US 9,091,721 B2
(45) Date of Patent: Jul. 28, 2015

(54) MULTI-FUNCTIONAL ONLINE TESTING SYSTEM FOR SEMICONDUCTOR LIGHT-EMITTING DEVICES OR MODULES AND METHOD THEREOF

(71) Applicant: INSTITUTE OF SEMICONDUCTORS, CHINESE ACADEMY OF SCIENCE, Beijing (CN)

(72) Inventors: Lixia Zhao, Beijing (CN); Zichao Zhou, Beijing (CN); Hua Yang, Beijing (CN); Junxi Wang, Beijing (CN); Jinmin Li, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 176 days.

(21) Appl. No.: 14/056,389

(22) Filed: Oct. 17, 2013

(65) Prior Publication Data

US 2015/0015266 A1 Jan. 15, 2015

(30) Foreign Application Priority Data

Jul. 15, 2013 (CN) .......................... 2013 1 0296013

(51) Int. Cl.
*G01R 31/00* (2006.01)
*G01R 31/26* (2014.01)

(52) U.S. Cl.
CPC ........ *G01R 31/2635* (2013.01); *G01R 31/2642* (2013.01)

(58) Field of Classification Search
CPC .......................... G01R 31/2635; G01R 31/2642

USPC ................................ 324/414, 762.08, 762.09
See application file for complete search history.

(56) References Cited

U.S. PATENT DOCUMENTS 5,381,103 A    1/1995  Edmond et al.
2011/0025337 A1*  2/2011  Morrow et al. ................ 324/414

FOREIGN PATENT DOCUMENTS

| CN | 1090053 A | 7/1994 |
| CN | 1046350 C | 11/1999 |
| CN | 101266280 A | 9/2008 |

(Continued)

OTHER PUBLICATIONS

Office Action issued Feb. 17, 2015 from SIPO of China in counterpart Chinese Patent Application No. 201310296013.3.
Kevin J. Dowling et al., "IESNA Approved Method for Lumen Maintenance Testing of LED Light Sources" Illuminating Engineering Society of North America, pp. 1-10, (2008).

(Continued)

*Primary Examiner* — Vincent Q Nguyen
(74) *Attorney, Agent, or Firm* — Browdy and Neimark, PLLC

(57) ABSTRACT

The disclosure provides a system and method for multi-functional online testing of semiconductor light-emitting devices or modules. The system includes an electrical characteristic generating and testing equipment, one or more optical characteristic detecting and controlling equipments, an optical signal processing and analyzing equipment, one or more thermal characteristic detecting equipments, a central monitoring and processing computer, a multi-channel integrated drive controlling equipment, one or more multi-stress accelerated degradation controlling equipments, and one or more load boards. The present disclosure enables in-situ online monitoring and testing under accelerated degradation in a multi-stress accelerated degradation environment.

12 Claims, 3 Drawing Sheets

(56) References Cited

FOREIGN PATENT DOCUMENTS

| CN | 101452044 A | 6/2009 |
|---|---|---|
| CN | 101699235 A | 4/2010 |
| CN | 101900786 A | 12/2010 |
| CN | 102096034 A | 6/2011 |
| CN | 102608509 A | 7/2012 |
| CN | 102944826 A | 2/2013 |
| CN | 103149523 A | 6/2013 |
| JP | 2013011462 A | 1/2013 |
| WO | 0205051 A2 | 1/2002 |

OTHER PUBLICATIONS

Ralph Tuttle et al., "Projecting Long Term Lumen Maintenance of LED Packages" Illuminating Engineering Society of North America, pp. 1-48, (2008).

SJ/T11394-2009 "Testing Methods for Semiconductor Light-Emitting Diode Chips" pp. 1-11 (2009) [Brief description of relevance appears at paragraph [0004] of the present specification].

SJ/T 11394-2009 "Testing Methods for Semiconductor Light-Emitting Diodes" pp. 1-26 (2009) [Brief description of relevance appears at paragraph [0004] of the present specification].

Goodman, T. et al., "Measurement of LEDS", CIE pp. 1-40, (2007).

* cited by examiner

MULTI-FUNCTIONAL ONLINE TESTING SYSTEM FOR SEMICONDUCTOR LIGHT-EMITTING DEVICES OR MODULES AND METHOD THEREOF

TECHNICAL FIELD

The present disclosure relates to testing of semiconductor light-emitting diodes (LEDs), and particularly to a multi-functional online testing system for semiconductor light-emitting devices or modules and a method thereof. More particularly, the present disclosure relates to a system for accelerated degradation and in-situ online comprehensive testing of the semiconductor light-emitting devices or modules in various package forms under controllable multi-stress conditions and method thereof.

BACKGROUND

LEDs are solid light-emitting devices that generate light from semiconductor chips. In the LED, a PN junction is formed in a semiconductor material so that light is generated by recombination of electrons and holes when an external electric field is applied thereto. In this way, electric energy is converted to optical energy directly. Color of the light emitted from the LED may vary with different semiconductor materials.

In 1907, Henry Joseph Round manufactured a first LED. After about a half-century of development, the LEDs have been successfully manufactured from SiC and III-V Group compounds and have wavelengths covering infrared, red, orange, yellow, and green wavelengths. In the mid-1990s, with continuous breach of GaN epitaxial material, p-type doping, and chip structure design, LEDs of blue, white, and ultra-violet light, an example of which is nitride LEDs, have achieved rapid development.

Currently, testing methods and standards of the LEDs are attracting increasing attention. For example, the National Institute of Standards and Technology (NIST) are trying to establish testing methods and standards for testing light-emitting, temperature, and light-attenuation characteristics of the LEDs. The International Commission on Illumination (CIE) issued CIE127-2007 LED testing methods defining the LED light intensity as an average intensity thereof and specifying a uniform testing structure and size of detectors. However, with rapid development of LED technology, the CIE127-2007 methods become insufficient for testing new LED characteristics. In 2008, the Illuminating Engineering Society of North America (IESNA) published "IESNA LM 80-08: Approved Method: Measuring Lumen Maintenance of LED Light Sources," defining nominal lumen maintenance life of LED light sources. In 2011, the IESNA published "LESNA TM 21-11: Projecting Long Term Lumen Maintenance of LED Light Sources." China also makes great achievement in semiconductor light-emitting materials, chip technology, and testing of encapsulated products and has issued nine industrial standards concerning semiconductor illumination. Among these standards, "SJ/T11399-2009: Testing Methods for Semiconductor Light-Emitting Diode Chips" and "SJ/T11394-2009: Testing Methods for Semiconductor Light-Emitting Diodes" provide specification for testing methods of electrical, optical, chromatic, radiation, and thermal characteristics as well as sensitivity to static electricity discharge of the LEDs.

Besides being energy-efficient and pollution-free, the LEDs have another advantage of long lifetime. Typically, the LEDs will not become ineffective suddenly. However, light-emitting performance of the LEDs may degrade with lapse of time. Therefore, it is important to improve reliability and lifetime of the LEDs. LED accelerated degradation online in-situ testing is an important testing method of the LED performances. However, current LED testing technology is insufficient for testing the LED performances such as the reliability and lifetime.

The reliability of the LEDs can be tested by the accelerated degradation method. John. A. EDMOND et al. discloses "System and Method for Accelerated Degradation Testing of Semiconductor Devices," providing a system for testing on-chip semiconductor devices. In this system, pulses of predetermined current amount are applied to the semiconductor devices within a time period and electrical or optical characteristics of the semiconductor devices are measured before, amidst, and after the application of the pulses. The system is suitable for testing single-chip semiconductor devices made from SiC.

Chinese patent application No. 201110435006.8, entitled "System and Method for Carrying out Optical/Electrical/Thermal Aging Comprehensive Testing on Light-Emitting Diodes," provides a system and method for implementing in-situ optical/electrical/thermal comprehensive testing of one or more LEDs in an environment of accelerated degradation. However, this system and method cannot effectively test the reliability of the LEDs due to the following reasons.

According to this technology, the devices are subjected to degradation under a constant junction temperature implemented by a constant ambient temperature and current. In this manner, it is possible to find weakness of the LEDs and predict lifetime thereof under the constant junction temperature rapidly. However, in order to predict the lifetime of the LEDs under arbitrary junction temperatures, it may be necessary to use one or more such systems to perform the online comprehensive accelerated degradation testing under different constant junction temperatures. This is laborious and expensive as well as inconvenient for rapid prediction of the lifetime of the LEDs.

This technology does not take into account the influence of humidity and ultraviolet radiation on the LEDs. This influence of humidity and ultraviolet radiation may vary under different currents and temperatures. The humidity and ultraviolet radiation should thus also be taken into account in the accelerated stress environment.

Multi-chip integrated LED modules are becoming widely used in semiconductor illumination products, and thus the testing system should be adapted to test such LED modules.

SUMMARY

The present disclosure aims to provide, among others, a system and method for multi-functional online testing of semiconductor light-emitting devices or modules in order to implement in-situ online monitoring and testing under accelerated degradation in a multi-stress accelerated degradation environment.

According to an aspect of the present disclosure, a system for multi-functional online testing of semiconductor light-emitting devices or modules comprises:

one or more load boards configured to accommodate one or more semiconductor light-emitting devices or modules of different types;

one or more optical characteristic detecting and controlling equipments each configured to convert optical signals emitted from corresponding ones of the one or more semiconductor light-emitting devices or modules into electrical signals;

an optical processing and analyzing equipment connected with the one or more optical characteristic detecting and controlling equipments and configured to process and analyze the electrical signals output from the one or more optical characteristic detecting and controlling equipments one or more thermal characteristic detecting equipments each connected with a corresponding one of the one or more load boards and configured to detect thermal characteristics of corresponding ones of the one or more semiconductor light-emitting devices or modules, the thermal characteristic comprising thermal resistance, junction temperature, and/or spatial distribution of temperature;

one or more multi-stress accelerated degradation controlling equipments each connected with a corresponding one of the one or more load boards and configured to provide a multi-stress accelerated degradation environment to corresponding ones of the one or more semiconductor light-emitting devices or modules, the multi-stress accelerated degradation environment comprising a constant case temperature, humidity, and light radiation;

an electrical characteristic generating and testing equipment connected with the one or more load boards and configured to provide electrical signals for turning on the one or more semiconductor light-emitting devices or modules, apply electrical stresses on the one or more semiconductor light-emitting devices or modules, and measure electrical characteristics of the respective semiconductor light-emitting devices or modules;

a multi-channel integrated drive controlling equipment connected with the electrical characteristic generating and testing equipment and the one or more load boards and configured to provide a stimulus source to the one or more semiconductor light-emitting devices or modules and switch signal channels between the one or more load boards in such a way that different semiconductor light-emitting devices or modules are independently subjected to accelerated degradation under different electrical stress conditions; and a central monitoring and processing computer connected with the electrical characteristic generating and testing equipment, the optical signal processing and analyzing equipment, the multi-channel drive integrated controlling equipment, the one or more multi-stress accelerated degradation controlling equipments, and the one or more thermal characteristic detecting equipments, and configured to control transfer, collection, and analysis of data.

According to another aspect of the present disclosure, a method for multi-functional online testing of semiconductor light-emitting devices or modules comprises:

placing one or more semiconductor light-emitting devices or modules in one or more load boards, respectively;

placing the one or more load boards accommodating the one or more semiconductor light-emitting devices or modules in one or more multi-stress accelerated degradation controlling equipment, respectively, and adjusting a case temperature to a preset reference value;

measuring respective electrical and optical characteristics of the one or more semiconductor light-emitting devices or modules under control of a central monitoring and processing computer;

measuring respective voltages of the one or more semiconductor light-emitting devices or modules in a constant low-current input condition;

adjusting the case temperature and measuring the respective voltages of the one or more semiconductor light-emitting devices or modules in the low-current input condition at different case temperatures to obtain a correspondence between the case temperatures and the voltages for each of the one or more semiconductor light-emitting devices or modules;

applying a high current level to the one or more semiconductor light-emitting devices or modules and, after the one or more semiconductor light-emitting devices or modules reach a stable state, switching to the low current level and monitoring variations of the respective voltages of the one or more semiconductor light-emitting devices or modules by the central monitoring and processing computer to obtain respective correspondences between the temperatures and the voltages, based on which junction temperatures and thermal resistances of the one or more semiconductor light-emitting devices or modules in a particular input condition can be calculated;

setting a multi-stress accelerated degradation environment according to physical characteristics of the one or more semiconductor light-emitting devices or modules and setting, by the central monitoring and processing computer, a degradation period to test electrical and optical characteristics of each of the one or more semiconductor light-emitting devices or modules at a constant time interval, wherein the multi-stress accelerated degradation environment comprises current, case temperature, ambient humidity, and light radiation; and obtaining the optical, chromatic, electrical, and thermal characteristics of the one or more semiconductor light-emitting devices or modules after the degradation period.

The present disclosure may have one or more of the following advantages.

The system and method provided by the present disclosure place the one or more load boards accommodating the one or more semiconductor light-emitting devices or modules in respective multi-stress accelerated controlling equipments. The electrical characteristic generating and testing equipment turns on the semiconductor light-emitting devices or modules and measures the electrical characteristics thereof. The multi-channel integrated drive controlling equipment switches signal channels between the semiconductor light-emitting devices or modules. The optical characteristic detecting and controlling equipments receive and convert the light signals from the semiconductor light-emitting devices or modules to electrical signals and transmit the same to the optical signal processing and analyzing equipment for analysis. The thermal characteristic detecting equipments detect the thermal characteristics of the semiconductor light-emitting devices or modules, the thermal characteristics comprising the thermal resistance, the junction temperature, and the spatial temperature distribution. Data transfer between these equipments and analysis of the data are controlled by the central monitoring and processing computer. In this way, the in-situ online monitoring and testing can be implemented under the multi-stress accelerated degradation environment. As such, it is possible to determine the weakness in the devices or modules and predict the lifetime thereof rapidly.

The system and method provided by the present disclosure can accelerate degradation of the semiconductor light-emitting devices or modules at different junction temperatures to facilitate rapid prediction of the lifetime thereof. The system and method take into account both the influence of the humidity and ultraviolet radiation and that of the temperature and current on the devices or modules. Moreover, the load boards are adapted to accommodate different types of devices.

The load boards according to the present disclosure can accommodate both LED devices and multi-chip LED modules and can be placed in different stress environments. The lifetime of the LED devices or modules under different conditions can thus be predicted directly and rapidly.

BRIEF DESCRIPTION OF THE DRAWINGS

Embodiments of the present disclosure will be further described in connection with specific embodiments with reference to accompanying drawings, in which.

DETAILED DESCRIPTION

The present disclosure will be explained in detail in connection with specific embodiments with reference to accompanying drawings, such that objects, solutions, and advantages thereof will become apparent.

According to the present disclosure, optical, chromatic, electrical, and thermal characteristics of one or more semiconductor light-emitting devices or modules are tested in an accelerated degradation environment. One or more load boards accommodating one or more semiconductor light-emitting devices or modules are placed in respective multi-stress accelerated degradation controlling equipments. An electrical characteristic generating and testing equipment turns on the semiconductor light-emitting devices or modules and measures the electrical characteristics of the semiconductor light-emitting devices or modules. A multi-channel integrated drive controlling equipment switches signal channels between the semiconductor light-emitting devices or modules. One or more optical characteristic detecting and controlling equipments receive and convert light signals from the semiconductor light-emitting devices or modules to electrical signals and transmit the same to an optical signal processing and analyzing equipment for analysis. One or more thermal characteristic detecting equipments detect thermal characteristics of the semiconductor light-emitting devices or modules, the thermal characteristics comprising the thermal resistance, the junction temperature, and the spatial temperature distribution. Data transfer between these equipments and analysis of the data are controlled by the central monitoring and processing computer.

Figure 1:
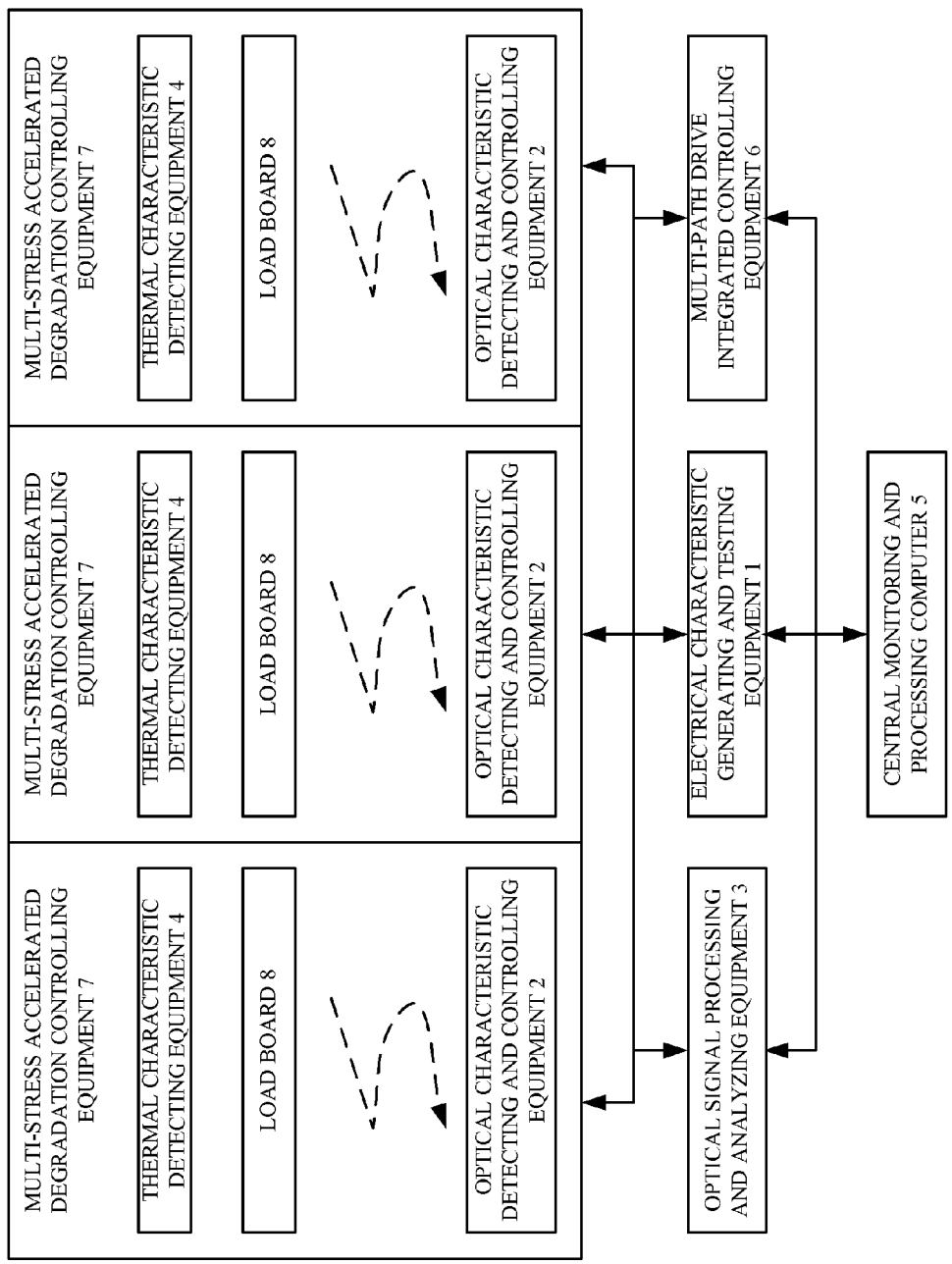
FIG. 1 schematically shows a block diagram of a system for multi-functional online testing of semiconductor light-emitting devices or modules according to an embodiment of the present disclosure.

FIG. 1 schematically shows a block diagram of a system for multi-functional online testing of semiconductor light-emitting devices or modules according to an embodiment of the present disclosure. The system comprises an electrical characteristic generating and testing equipment 1, one or more optical characteristic detecting and controlling equipments 2, an optical signal processing and analyzing equipment 3, one or more thermal characteristic detecting equipments 4, a central monitoring and processing computer 5, a multi-channel integrated drive controlling equipment 6, one or more multi-stress accelerated degradation controlling equipments 7, and one or more load boards 8.

The one or more load boards 8 are configured to accommodate one or more semiconductor light-emitting devices or modules of different types. The one or more optical characteristic detecting and controlling equipments 2 are each configured to convert optical signals emitted from corresponding ones of the one or more semiconductor light-emitting devices or modules into electrical signals. The optical processing and analyzing equipment 3 is connected with the one or more optical characteristic detecting and controlling equipments 2 and configured to process and analyze the electrical signals output from the one or more optical characteristic detecting and controlling equipments 2. The one or more thermal characteristic detecting equipments 4 are each connected with a corresponding one of the one or more load boards 8 and configured to detect thermal characteristics of corresponding ones of the one or more semiconductor light-emitting devices or modules, the thermal characteristics comprising thermal resistance, junction temperature, and/or spatial distribution of temperature, etc. The one or more multi-stress accelerated degradation controlling equipment 7 are each connected with a corresponding one of the load boards 8 and configured to provide accelerated degradation environment to corresponding ones of the one or more semiconductor light-emitting devices or modules, the accelerated degradation environment comprising a constant case temperature, humidity, and light radiation, etc. The electrical characteristic generating and testing equipment 1 is connected with the one or more load boards 8 and configured to provide electrical signals for turning on the one or more semiconductor light-emitting devices or modules, apply electrical stresses on the one or more semiconductor light-emitting devices or modules, and measure electrical characteristics of the respective semiconductor light-emitting devices or modules. The multi-channel integrated drive controlling equipment 6 is connected with the electrical characteristic generating and testing equipment 1 and the one or more load boards 8 and configured to provide a stimulus source to the one or more semiconductor light-emitting devices or modules and switch signal channels between the one or more load boards 8 in such a way that different load boards are subjected to accelerated degradation under different electrical stress conditions independently from each other. The central monitoring and processing computer 5 is connected with the electrical characteristic generating and testing equipment 1, the optical signal processing and analyzing equipment 3, the multi-channel integrated drive controlling equipment 6, the one or more multi-stress accelerated degradation controlling equipments 7, and the one or more thermal characteristic detecting equipments 4, and configured to control transfer, collection, and analysis of data by running software.

The semiconductor light-emitting device may be an LED device emitting light from a PN junction. The semiconductor light-emitting module may comprise one or more LEDs connected in series or in parallel. The semiconductor light-emitting devices or modules may emit light covering one or more of ultraviolet, visible, and infrared wavelengths. The one or more load boards 8 may comprise one or more load circuit boards for accommodating the one or more semiconductor light-emitting devices or modules of the different types. In this way, the one or more semiconductor light-emitting devices or modules of the different types may be subjected to different accelerated degradation in the multi-stress accelerated degradation environment independently from each other. The multi-stress accelerated degradation environment may comprise current, temperature, humidity, and light radiation, etc. The load boards 8 may comprise resistors connected in series or in parallel to provide the accelerated degradation environment to the one or more semiconductor light-emitting devices or modules simultaneously. If one of the semiconductor light-emitting devices or modules becomes ineffective, the degradation may continue without manual interaction. The electrical characteristic generating and testing equipment 1 is configured to provide the electrical signals for turning on the semiconductor light-emitting devices or modules, apply electrical stress on the semiconductor light-emitting devices or modules, and measure the electrical characteristics of respective semiconductor light-emitting devices or modules. The electrical characteristics may include current-voltage characteristic scanning curves. The optical characteristic detecting and controlling equipment 2 comprises an optical detecting equipment and an optical controlling equipment. The optical detecting equipment may comprise a photodiode for converting the received optical signals into electrical signals. The optical controlling equipment may be a controlling circuit for providing current operation condition to the optical detecting equipment.

The system may implement two operation modes including a testing mode and a stress mode. In the testing mode, the multi-channel controlling drive equipment switches between multiple signal channels at a preset time interval to implement measurement of the optical, electrical, and thermal characteristics of respective semiconductor light-emitting devices or modules in sequence. In the stress mode, all of the semiconductor light-emitting devices or modules are subjected to stress under a certain stress condition.

Figure 2:
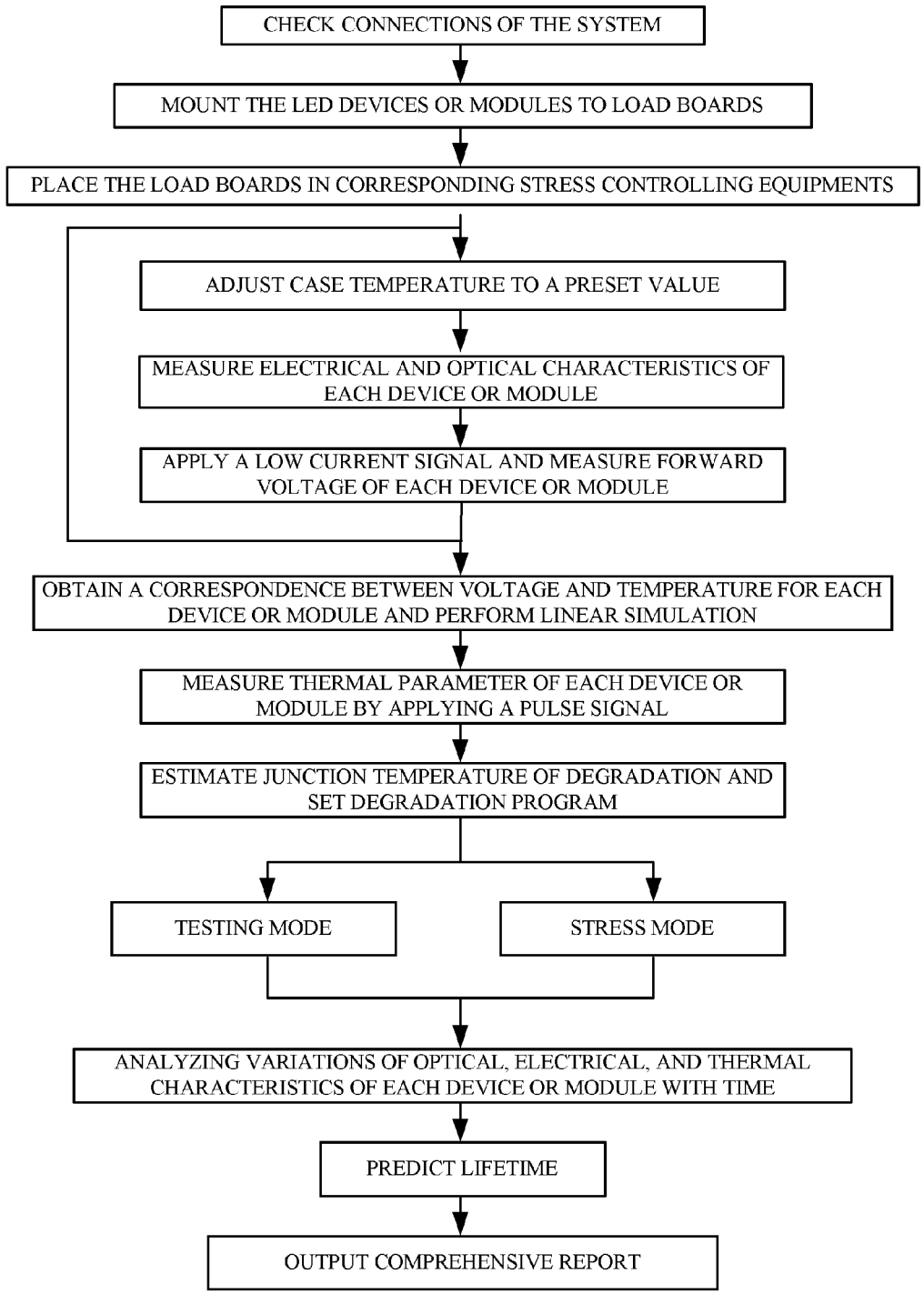
FIG. 2 schematically shows a flow diagram of a method for multi-functional online testing of semiconductor light-emitting devices or modules according to an embodiment of the present disclosure.

FIG. 2 schematically shows a flow diagram of a method for multi-functional online testing of semiconductor light-emitting devices or modules using the system as shown in FIG. 1 according to an embodiment of the present disclosure. The method may comprise the following steps.

In step 1, connections between various equipments of the system are checked.

In step 2, one or more semiconductor light-emitting devices or modules are placed in the one or more load boards. The one or more semiconductor light-emitting devices or modules may be encapsulated in an in-line package or a surface-mount package.

In step 3, the one or more load boards accommodating the one or more semiconductor light-emitting devices or modules are placed in one or more multi-stress accelerated degradation controlling equipments, respectively. A case temperature is adjusted to a preset reference value.

In step 4, respective electrical and optical characteristics of the one or more semiconductor light-emitting devices or modules are measured under control of a central monitoring and processing computer.

In step 5, respective voltages of the one or more semiconductor light-emitting devices or modules are measured in a low-current input condition.

In step 6, the case temperature is adjusted and the respective voltages of the one or more semiconductor light-emitting devices or modules in the low-current condition at different case temperatures are measured to obtain a correspondence between the case temperatures and the voltages for each of the one or more semiconductor light-emitting devices or modules.

In step 7, a high current level is applied to the one or more semiconductor light-emitting devices or modules and, after the one or more semiconductor light-emitting devices or modules reach a stable state, is switched to the low current level rapidly. Variations of the respective voltages of the one or more semiconductor light-emitting devices or modules are monitored by the central monitoring and processing computer to obtain correspondences between the temperatures and the voltages, based on which junction temperatures and thermal resistances of the one or more semiconductor light-emitting devices or modules under a particular electrical input condition are calculated.

In step 8, a multi-stress accelerated degradation environment is set according to physical characteristics of the one or more semiconductor light-emitting devices or modules, the physical characteristics comprising optical, chromatic, electrical, and thermal characteristics. A stress period is set by the central monitoring and processing computer to test electrical and optical characteristics of each of the one or more semiconductor light-emitting devices or modules at a constant time interval. The multi-stress accelerated degradation environment comprises current, case temperature, ambient humidity, and light radiation, etc.

In step 9, the optical, chromatic, electrical, and thermal characteristics of the one or more semiconductor light-emitting devices or modules are obtained after the stress period.

In step 10, the optical, chromatic, electrical, and thermal characteristics of the one or more semiconductor light-emitting devices or modules before, amidst, and after the degradation are analyzed. Curves of light intensities vs. stress time of the one or more semiconductor light-emitting devices or modules under different stress conditions are plotted using computer software.

In step 11, lifetime of the one or more semiconductor light-emitting devices or modules is predicted using Arrhenius equation.

In step 12, a comprehensive report about the physical characteristics of the one or more semiconductor light-emitting devices or modules is obtained and output.

In one embodiment of the present disclosure, optical, electrical, and thermal characteristics of two types of power LEDs are measured and lifetime thereof is predicted.

The two types of power LED devices, each type including 20 LED devices, are placed on two load boards, respectively. Each load board carries 20 LED devices.

The optical, electrical, and thermal characteristics of these LED devices are measured at a case temperature of 25° C. and current of 350 mA.

Table 1 shows testing data of the first load board.

TABLE 1

|  | No. | CURRENT (mA) | VOLTAGE (V) | THERMAL RESISTANCE (K/W) | LIGHT INTENSITY (W) | TIME (hrs) |
| --- | --- | --- | --- | --- | --- | --- |
| TYPE 1 | 1 | 350 | 3.2599 | 11.12222 | 0.47754 | 0 |
|  | 2 | 350 | 3.2477 | 11.42222 | 0.48133 | 0 |
|  | 3 | 350 | 3.2664 | 11.11111 | 0.484 | 0 |
|  | 4 | 350 | 3.2731 | 11.33333 | 0.48371 | 0 |
|  | 5 | 350 | 3.286 | 11.36667 | 0.47822 | 0 |
|  | 6 | 350 | 3.2466 | 11.11111 | 0.49251 | 0 |
|  | 7 | 350 | 3.2916 | 11.32222 | 0.47565 | 0 |
|  | 8 | 350 | 3.2461 | 11.2 | 0.47833 | 0 |
|  | 9 | 350 | 3.2787 | 11.11111 | 0.49439 | 0 |
|  | 10 | 350 | 3.2555 | 11.4875 | 0.49663 | 0 |
| TYPE 2 | 11 | 350 | 3.3724 | 9.89 | 0.3831 | 0 |
|  | 12 | 350 | 3.3887 | 10.5 | 0.38116 | 0 |
|  | 13 | 350 | 3.3696 | 10.06 | 0.39626 | 0 |
|  | 14 | 350 | 3.4067 | 9.95 | 0.3944 | 0 |
|  | 15 | 350 | 3.3647 | 10.02 | 0.38076 | 0 |
|  | 16 | 350 | 3.3733 | 9.77 | 0.38487 | 0 |
|  | 17 | 350 | 3.3457 | 9.93 | 0.40094 | 0 |

TABLE 1-continued

| No. | CURRENT (mA) | VOLTAGE (V) | THERMAL RESISTANCE (K/W) | LIGHT INTENSITY (W) | TIME (hrs) |
|---|---|---|---|---|---|
| 18 | 350 | 3.3775 | 10.12 | 0.39495 | 0 |
| 19 | 350 | 3.367 | 9.93 | 0.39735 | 0 |
| 20 | 350 | 3.351 | 9.81 | 0.3782 | 0 |

Table 2 shows testing data of the second load board.

| | No. | CURRENT (mA) | VOLTAGE (V) | THERMAL RESISTANCE (K/W) | LIGHT INTENSITY (W) | TIME (hrs) |
|---|---|---|---|---|---|---|
| TYPE 1 | 1 | 350 | 3.2372 | 8.93333 | 0.4732 | 0 |
| | 2 | 350 | 3.2251 | 9.27778 | 0.4770 | 0 |
| | 3 | 350 | 3.2673 | 9.27778 | 0.4796 | 0 |
| | 4 | 350 | 3.2503 | 9.73333 | 0.4793 | 0 |
| | 5 | 350 | 3.2631 | 8.81111 | 0.4739 | 0 |
| | 6 | 350 | 3.2240 | 9.68889 | 0.4881 | 0 |
| | 7 | 350 | 3.2687 | 9.4 | 0.4714 | 0 |
| | 8 | 350 | 3.2233 | 9.21111 | 0.4740 | 0 |
| | 9 | 350 | 3.2514 | 9.18889 | 0.4899 | 0 |
| | 10 | 350 | 3.2328 | 9.31111 | 0.4922 | 0 |
| TYPE 2 | 11 | 350 | 3.3489 | 7.64 | 0.3796 | 0 |
| | 12 | 350 | 3.3651 | 7.84 | 0.3777 | 0 |
| | 13 | 350 | 3.346 | 7.9 | 0.3927 | 0 |
| | 14 | 350 | 3.3838 | 8.1 | 0.3908 | 0 |
| | 15 | 350 | 3.3414 | 7.54 | 0.3773 | 0 |
| | 16 | 350 | 3.349 | 7.89 | 0.3814 | 0 |
| | 17 | 350 | 3.322 | 7.76 | 0.3973 | 0 |
| | 18 | 350 | 3.3540 | 7.58 | 0.3914 | 0 |
| | 19 | 350 | 3.3435 | 7.68 | 0.3938 | 0 |
| | 20 | 350 | 3.3277 | 7.56 | 0.3748 | 0 |

Figure 3:
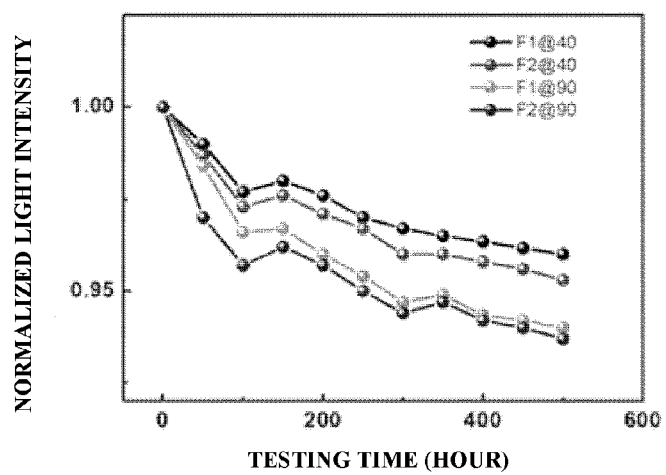
FIG. 3 schematically shows curves of light intensity vs. time obtained through accelerated degradation testing of two sets of different LED devices according to an embodiment of the present disclosure.

The central processing computer controls to enter a stress mode, in which all of the LED devices are subjected to accelerated degradation at temperatures of 40° C. and 90° C., current of 350 mA and humidity of 50%. An interval between the degradation and measurement is set to 50 hours. A total time of the measurement and the degradation is set to be 500 hours. As such, the optical, electrical, and thermal characteristics of the LED devices, which vary with time, are obtained for the 500 hours. FIG. 3 schematically shows curves of light intensity vs. time.

Figure 4:
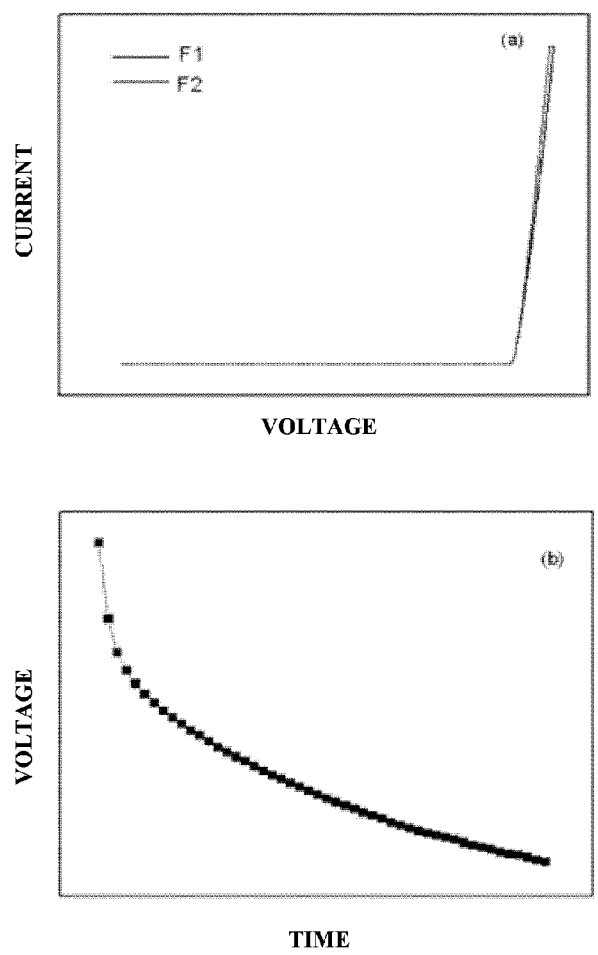
FIG. 4 schematically shows (a) curves of current vs. voltage and (b) curves showing self-heating effect obtained by monitoring voltage variations measured with respect to two sets of different LEDs.

A current-voltage characteristic and self-heating effect of each device may be measured at a time interval which can be set arbitrarily. FIG. 4 schematically shows (a) curves of current vs. voltage and (b) curves showing self-heating effect obtained by monitoring voltage variations measured with respect to the two different sets of LEDs.

The life time of the device when light emitted therefrom degrades by 70% of original light intensity according to Arrhennius model may be expressed by equation (1):

$$L = \frac{\ln\left(\frac{B}{0.7}\right)}{\alpha} \quad (1)$$

wherein L is the lumen maintenance life expected in hours, α is a decay rate, and B is a constant.

$$\ln(L50° C.) = k\frac{1}{T_{50° C.}} + b \quad (2)$$

wherein $L_{50C}$ is the lumen maintenance life of the device at the case temperature of 50° C., $T_{50C}$ is the absolute temperature corresponding to the case temperature of 50° C., k is determined by activation energy, and b is determined by the following equations (3) and (4):

$$k = \frac{\ln\left(\frac{L_{90° C.}}{L_{40° C.}}\right)}{\frac{1}{T_{90° C.}} - \frac{1}{T_{40° C.}}} \quad (3)$$

$$b = \ln L_{40° C.} - \frac{\ln\left(\frac{L_{90° C.}}{L_{40° C.}}\right)}{\frac{T_{40° C.}}{T_{90° C.}} - 1} \quad (4)$$

wherein $L_{90C}$ and $L_{40C}$ is the lumen maintenance life of the device at the case temperatures of 90° C. and 40° C., respectively, and $T_{40C}$ and $T_{90C}$ are the absolute temperatures corresponding to the case temperatures of 40° C. and 90° C., respectively.

The lumen maintenance life of the first and second types of LED devices at the case temperatures 90° C. and 40° C. and current of 350 mA are 20,300 hours and 24,585 hours, respectively.

The multi-channel integrated drive controlling equipment 6 according to the present disclosure may provide a stimulus source to the devices and modules on the load boards and switches the signal channels between different circuit boards. As such, the load boards can be subjected to the accelerated degradation under different stress conditions simultaneously independently from each other. Accordingly, the lifetime of the devices can be predicted simultaneously, which improves the efficiency of lifetime prediction.

The multi-stress accelerated degradation controlling equipments 7 according to the present disclosure may provide a constant case temperature and an accelerated degradation environment including humidity and light radiation to the semiconductor light-emitting devices or modules.

The load boards 8 according to the present disclosure may comprise the load boards for accommodating the semiconductor light-emitting devices or modules of different types. The semiconductor light-emitting devices or modules may be passive devices or modules emitting light from PN junctions. The light emitted from the semiconductor light-emitting devices or modules may cover ultraviolet, visible, and infrared wavelengths. The semiconductor light-emitting devices may be encapsulated in an in-line package or a surface-mount package. The semiconductor light-emitting modules may be multi-chip modules.

The objects, solutions, and advantages of the present disclosure have been explained in detail in connection with the foregoing specific embodiments. It should be understood that these embodiments are only exemplary rather than limiting scope of the present disclosure. Any modifications, substitutions, and improvements should fall within the scope of the present disclosure without departing from the spirit and principle of the present disclosure.

We claim:

1. A system for multi-functional online testing of semiconductor light-emitting devices or modules, comprising:

one or more load boards configured to accommodate one or more semiconductor light-emitting devices or modules of different types;

one or more optical characteristic detecting and controlling equipments each configured to convert optical signals received from corresponding ones of the one or more semiconductor light-emitting devices or modules into electrical signals;

an optical processing and analyzing equipment connected with the one or more optical characteristic detecting and controlling equipments and configured to process and analyze the electrical signals output from the one or more optical characteristic detecting and controlling equipments to obtain optical characteristics of the semiconductor light-emitting devices or modules;

one or more thermal characteristic detecting equipments each connected with a corresponding one of the one or more load boards and configured to detect thermal characteristics of corresponding ones of the one or more semiconductor light-emitting devices or modules, the thermal characteristics comprising one or more of thermal resistance, junction temperature, and spatial distribution of temperature;

one or more multi-stress accelerated degradation controlling equipments each connected with a corresponding one of the one or more load boards and configured to provide a multi-stress accelerated degradation environment to corresponding ones of the one or more semiconductor light-emitting devices or modules, the multi-stress accelerated degradation environment comprising a constant case temperature, humidity, and light radiation;

an electrical characteristic generating and testing equipment connected with the one or more load boards and configured to provide electrical signals for turning on the one or more semiconductor light-emitting devices or modules, apply electrical stresses on the one or more semiconductor light-emitting devices or modules, and measure electrical characteristics of the respective semiconductor light-emitting devices or modules;

a multi-channel integrated drive controlling equipment connected with the electrical characteristic generating and testing equipment and the one or more load boards and configured to provide a stimulus source to the one or more semiconductor light-emitting devices or modules and switch signal channels between the one or more load boards in such a way that different semiconductor light-emitting devices or modules are independently subjected to accelerated degradation under different electrical stress conditions; and a central monitoring and processing computer connected with the electrical characteristic generating and testing equipment, the optical signal processing and analyzing equipment, the multi-channel integrated drive controlling equipment, the one or more multi-stress accelerated degradation controlling equipments, and the one or more thermal characteristic detecting equipments, and configured to control transfer, collection, and analysis of data.

2. The system according to claim 1, wherein:
the semiconductor light-emitting device is an LED device emitting light from a PN junction;
the semiconductor light-emitting module is a module comprising one or more LEDs connected in series and/or in parallel; and
the semiconductor light-emitting devices or modules emit light covering one or more of ultraviolet, visible, and infrared wavelengths.

3. The system according to claim 1, wherein the load boards comprises one or more load boards for accommodating the one or more semiconductor light-emitting devices or modules in such a way that the one or more semiconductor light-emitting devices or modules are subjected to accelerated degradation under different stresses in the multi-stress accelerated degradation environment independently from each other.

4. The system according to claim 3, wherein the multi-stress accelerated degradation environment comprises one or more of current, temperature, humidity, and light radiation.

5. The system according to claim 1, wherein:
the load boards comprise a plurality of resistors connected in series or in parallel and are configured to provide the multi-stress accelerated degradation environment to the one or more semiconductor light-emitting devices or modules simultaneously; and
if one of the semiconductor light-emitting devices or modules becomes ineffective, the degradation continues without manual interaction.

6. The system according to claim 1, wherein the electrical characteristic generating and testing equipment is configured to:
provide electrical signals for turning on the one or more semiconductor light-emitting devices or modules;
apply electrical stresses on the one or more semiconductor light-emitting devices or modules, and
measure electrical characteristics of the respective semiconductor light-emitting devices or modules, the electrical characteristics including current-voltage characteristic.

7. The system according to claim 1, wherein the optical characteristic detecting and controlling equipment comprises:
an optical detecting equipment comprising a photodiode for converting the received optical signals into the electrical signals; and
an optical controlling equipment comprising a controlling circuit for providing work voltage to the optical detecting equipment.

8. The system according to claim 1, wherein the system implements two operation modes including:
a testing mode in which the multi-channel drive controlling equipment switches between multiple signal channels at a preset time interval to implement measurement of the optical, electrical, and thermal characteristics of respective semiconductor light-emitting devices or modules in sequence; and
a stress mode in which all of the semiconductor light-emitting devices or modules are subjected to degradation at a certain stress condition.

9. A method for multi-functional online testing of semiconductor light-emitting devices or modules, comprising:
placing one or more semiconductor light-emitting devices or modules in one or more load boards, respectively;
placing the one or more load boards accommodating the one or more semiconductor light-emitting devices or modules in one or more multi-stress accelerated degradation controlling equipments, respectively, and adjusting a case temperature to a preset reference value;
measuring respective electrical and optical characteristics of the one or more semiconductor light-emitting devices or modules under control of a central monitoring and processing computer;
measuring respective voltages of the one or more semiconductor light-emitting devices or modules in a low-current input condition;

adjusting the case temperature and measuring the respective voltages of the one or more semiconductor light-emitting devices or modules in the low-current input condition at different case temperatures to obtain a correspondence between the case temperatures and the voltages for each of the one or more semiconductor light-emitting devices or modules;

applying a high current to the one or more semiconductor light-emitting devices or modules and, after the one or more semiconductor light-emitting devices or modules reach a stable state, switching to the low current level and monitoring variations of the respective voltages of the one or more semiconductor light-emitting devices or modules by the central monitoring and processing computer to obtain respective correspondences between the temperatures and the voltages, based on which junction temperatures and thermal resistances of the one or more semiconductor light-emitting devices or modules in a particular input condition are calculated;

setting a multi-stress accelerated degradation environment according to physical characteristics of the one or more semiconductor light-emitting devices or modules and setting, by the central monitoring and processing computer, a stress period to test electrical and optical characteristics of each of the one or more semiconductor light-emitting devices or modules at a constant time interval, wherein the multi-stress accelerated degradation environment comprises current, case temperature, ambient humidity, and light radiation; and obtaining the optical, chromatic, electrical, and thermal characteristics of the one or more semiconductor light-emitting devices or modules after the stress period.

10. The method according to claim 9, wherein:
the one or more semiconductor light-emitting devices or modules are placed in the one or more load boards; and
the one or more semiconductor light-emitting devices or modules are encapsulated in an in-line package or a surface-mount package.

11. The method according to claim 9, further comprising, before placing the one or more semiconductor light-emitting devices or modules in the one or more load boards:
checking whether various equipments in the system are connected properly.

12. The method according to claim 9, further comprising, after obtaining the optical, chromatic, electrical, and thermal characteristics of the one or more semiconductor light-emitting devices or modules after the stress period:
analyzing the optical, chromatic, electrical, and thermal characteristics of the one or more semiconductor light-emitting devices or modules before, amidst, and after the degradation;
plotting curves of light intensity vs. degradation time of the one or more semiconductor light-emitting devices or modules under different stress conditions using computer software;
predicting lifetime of the one or more semiconductor light-emitting devices or modules using Arrhennius equation; and
generating and outputting a comprehensive report about the physical characteristics of the one or more semiconductor light-emitting devices or modules.

* * * * *